United States Patent [19]

Evanchuk

[11] 4,376,160
[45] Mar. 8, 1983

[54] METHOD OF MAKING AND STRUCTURE FOR MONOLITHIC OPTICAL CIRCUITS

[75] Inventor: Vincent L. Evanchuk, Sherman Oaks, Calif.

[73] Assignee: California Institute of Technology, Pasadena, Calif.

[21] Appl. No.: 228,750

[22] Filed: Jan. 27, 1981

Related U.S. Application Data

[63] Continuation-in-part of Ser. No. 138,165, Apr. 7, 1980, abandoned.

[51] Int. Cl.³ .............................................. B05D 3/06
[52] U.S. Cl. .................................. 430/321; 427/43.1; 427/54.1; 427/162
[58] Field of Search ...................... 427/43.1, 54.1, 162; 430/321

[56] References Cited

PUBLICATIONS

Aeby, "Guided Wave Optical Systems & Devices II", Spie, vol. 176 (1979), pp. 155–160.
Takato et al., "Applied Optics", vol. 20, No. 8, pp. 1397–1401, Apr. 15, 1981.

Primary Examiner—John H. Newsome
Attorney, Agent, or Firm—Freilich, Hornbaker, Wasserman, Rosen & Fernandez

[57] ABSTRACT

A method for making monolithic optical circuits, with related optical devices as required or desired, on a supporting surface (10) consists of coating the supporting surface with reflecting metal or cladding resin, spreading a layer of liquid radiation senstivie plastic (12) on the surface, exposing the liquid plastic with a mask (14) to cure it in a desired pattern of light conductors (16, 18, 20), washing away the unexposed liquid plastic, and coating the conductors thus formed with reflective metal or cladding resin. The index of refraction for the cladding (22) is selected to be lower than for the conductors so that light in the conductors will be reflected by the interface with the cladding. For multiple level conductors, as where one conductor must cross over another, the process may be repeated to fabricate a "bridge" with columns (24, 26) of conductors to the next level, and conductor (28) between the columns. For more efficient transfer of energy over the bridge, faces at 45° may be formed to reflect light up and across the bridge.

4 Claims, 17 Drawing Figures

METHOD OF MAKING AND STRUCTURE FOR MONOLITHIC OPTICAL CIRCUITS

ORIGIN OF INVENTION

The invention described herein was made in the performance of work under a NASA contract and is subject to the provisions of Section 305 of the National Aeronautics and Space Act of 1958, Public Law 85-568 (72 Stat. 435; 42 USC 2457).

BACKGROUND OF THE INVENTION

The application is a continuation-in-part of application Ser. No. 06/138,165 filed Apr. 7, 1980 now abandoned.

This invention relates to a method for making monolithic optical circuits for optical devices, and to monolithic optical structures, and more particularly to forming light conductors interconnecting optical devices in monolithic modules.

Optical devices are presently interconnected by optical fibers cut to length. These have only two terminals—one at each end. To form branches, two or more fibers must be bonded to a common optical port using an adhesive having an index of refraction closely matched to that of the fibers. This bonding must usually be done at the ends of the fibers. The fibers are very small in diameter and must be handled with extreme care, bundled together for strength, and attached to a support at intervals. Fabrication of the equivalent of a printed circuit board comprised of these discrete fibers and optical devices is labor-intensive, expensive, slow and tedious, and not readily adapted to automated fabrication techniques.

Efforts have been made during the last decade to develop a method of fabrication of monolithic optical circuits. For a good summary of early methods, see U.S. Pat. No. 3,809,732 titled "Photo-Locking Technique for Producing Integrated Optical Circuit." There the problems of fabricating circuits with smooth light conductors is reviewed. Any roughness or irregularities in the conductor surfaces gives rise to high scattering losses. Such losses from one conductor may become a source of noise in an adjacent conductor.

An object of this invention is to provide an improved method of forming conductors of light for interconnecting optical components and modules. These light conductors may be formed with a plurality of branches and terminals. In a process similar to the fabrication of printed circuits, light-sensitive transparent resins are formed into conductors of light for interconnecting optical components into integrated circuit modules, and optical analogs of printed circuit cards may be formed—for interconnecting the modules.

SUMMARY OF THE INVENTION

In accordance with the present invention, a liquid radiation sensitive plastic, which will function as an optical conductor when hardened, is spread on a supporting substrate or surface and selectively exposed by radiation to fix or harden the exposed plastic. Then the remaining unexposed liquid plastic is washed away with a solvent. The term "radiation sensitive plastic" as used herein is intended to include any substance which is fixed or hardened by a particular radiation, such as any resin and reactive monomer mixed with a benzoin ether as a photosensitizer for ultraviolet light. Still other radiation curable plastic systems will occur to those skilled in the art. It is therefore intended that any such plastic system used in accordance with this invention be considered within the scope of the term "radiation sensitive plastic." If the entire optical circuit desired is formed in one layer, a reflective metal coating or a layer of cladding of different refractive index may be deposited on the conductors. The supporting surface is precoated with cladding resin or reflective metal. Through repeated sequences of the steps of spreading plastic, exposing selected paths and washing away unexposed liquid plastic, interconnecting conductors of many layers can be formed with interconnecting columns or posts as needed from points of one or more layers to points of other layers. Light sources, such as light emitting diodes, and light sensors, such as photodiodes, may be fabricated or embedded at necessary points in the monolithic structure as required to emit or sense light in a conductor thus produced.

The novel features that are considered characteristic of this invention are set forth with particularity in the appended claims. Although the process of this invention relates to the use of a photosensitive plastic to form the structure, the structure itself may be formed with other than photo techniques, either in whole or in part, such as by casting the plastic parts to be assembled into the structure. Consequently, the invention as it relates to structure should not be limited to the process except to the extent specified by the claims. Both the method and structure will best be understood from the following description when read in connection with the accompanying drawings.

DESCRIPTION OF PREFERRED EMBODIMENTS

Figure 1:
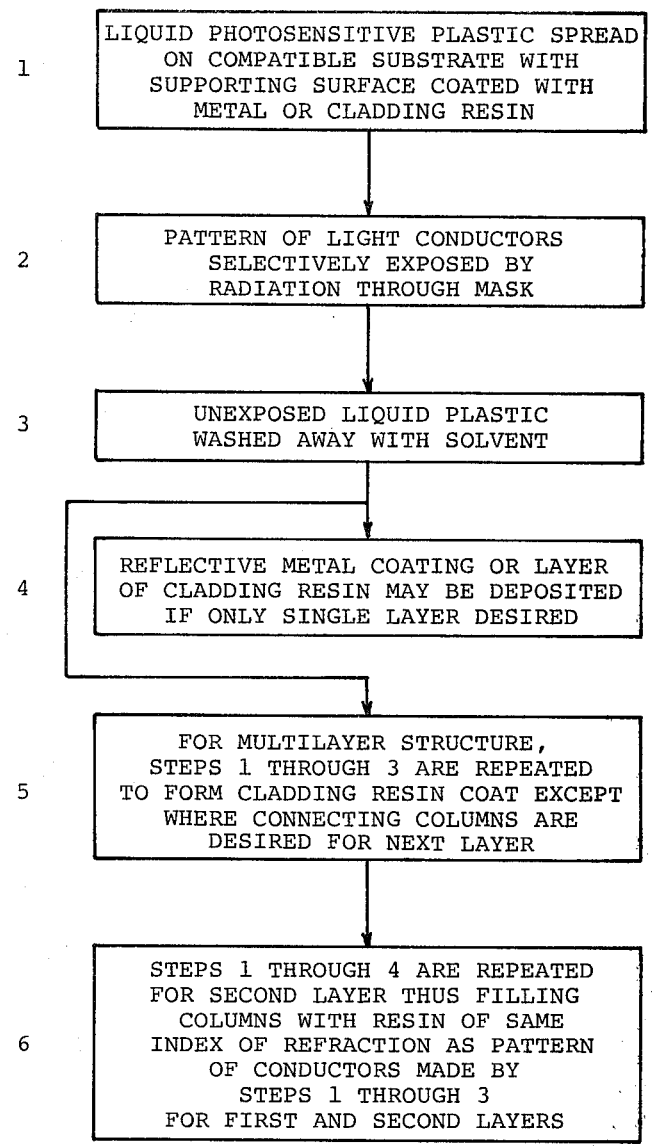
FIG. 1 is a flow chart outlining the basic steps for carrying out the present invention.

Referring now to the flow chart in FIG. 1, the first step in forming a monolithic optical circuit is to spread a liquid photosensitive plastic on a compatible substrate. The supporting surface of the substrate is preferably coated with reflecting metal, such as silver, to reduce loss of light into the substrate to virtually zero. The thickness of the plastic is controlled for the thickness of optical conductor to be fabricated. The coating may be spread evenly to the desired thickness by spinning the substrate while pouring the liquid plastic on the substrate. Although liquid in form, the plastic has a sufficiently high viscosity to permit this spin spreading.

A suitable radiation sensitive plastic is made using a benzoin ether photosensitizer for ultraviolet curable systems. These benzoin ether photosensitizers are made by the Specialty Chemical Division of Stauffer Chemical Company, Westport, Conn. 06880 and sold under the trademark VICURE 10 or VICURE 30. An early U.S. Pat. No. 2,448,828 assigned to E. I. duPont de Nemours describes the use of benzoin ether as a photosensitizer. Generally, 1 to 10% of VICURE 10 or VICURE 30 photosensitizer is mixed in a formulation containing suitable resins and reactive monomers for rapid, low-temperature, ultraviolet curing. The formulation is chosen for the desired refractive index which may be any chosen one for the conductor structure to be made, and a distinct refractive index for the cladding resin added later.

In the second step, the liquid photosensitive plastic is cured (hardened) in a desired pattern by exposure to radiation through a mask or by appropriately scanning a beam. The radiation used is ultraviolet light in the case of VICURE 10 or VICURE 30 photosensitizer, but may be light of other wavelength in other plastic systems, and may even be gamma, x-ray, electron or ion beam, etc. for still other plastic systems. The radiation may directly trigger the hardening, or trigger a previously inactive catalyst, or sublimate an inhibitor.

Once exposed to radiation, the resin is washed in step three with a suitable solvent, such as acetone, and any unexposed areas of resin will wash away, leaving only the desired pattern of hardened areas which will be used as light conductors.

If the desired optical circuit can be produced in one layer, the fourth and final step is to deposit a reflective metal coating, such as silver, or aluminum, or a cladding of another formulation with a benzoin ether photosensitizer of a lower index of refraction. All of the cladding plastic is cured, but first electrooptical devices, such as light emitting diodes and photodetectors may be embedded in the cladding plastic at appropriate points in the conductor circuit. In some applications the electrooptical devices may be fabricated on the substrate before the optical circuits are produced. Such devices may be, for example, light emitting diodes at one end of certain optical conductors, and photodiodes at the other end. Electrical leads from these devices may be connected to other similar monolithic optical circuit boards or utilization devices or systems. In that case, electrical conductors may be deposited using conventional metallizing techniques for integrated circuit boards before the optical circuits are produced, and in some cases between steps for producing the optical circuits. The interface between the cladding of low index of refraction and the conductor of high index of refraction will be reflective.

Assuming the desired pattern of conductors cannot be produced in one layer, such as when one conductor must cross over another conductor, the fourth step indicated in FIG. 1 is omitted, and the first three steps are repeated to form connecting light paths for conductors in the first layer to conductors in the next layer. That is indicated in FIG. 1 as step five. Then steps one through four are repeated for the second layer to complete the monolithic optical circuit. All of these exemplary steps will now be described with reference to FIGS. 2 through 6 for an illustrative keyboard circuit shown in FIG. 7, after which a preferred technique for forming the connecting columns to optimize reflection of light from one layer to the next in a multilayer monolithic optical circuit will be described.

Figure 2:
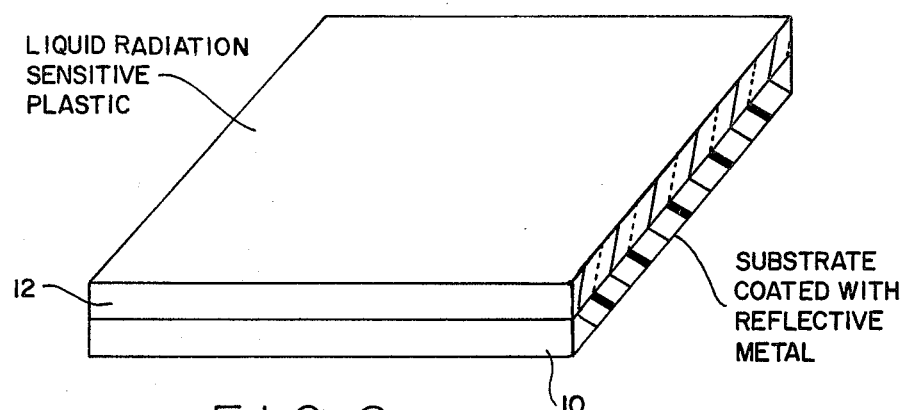
FIGS. 2 through 6 illustrate the basic steps involved in an illustrative application of the present invention to an optical circuit.
Figure 3:
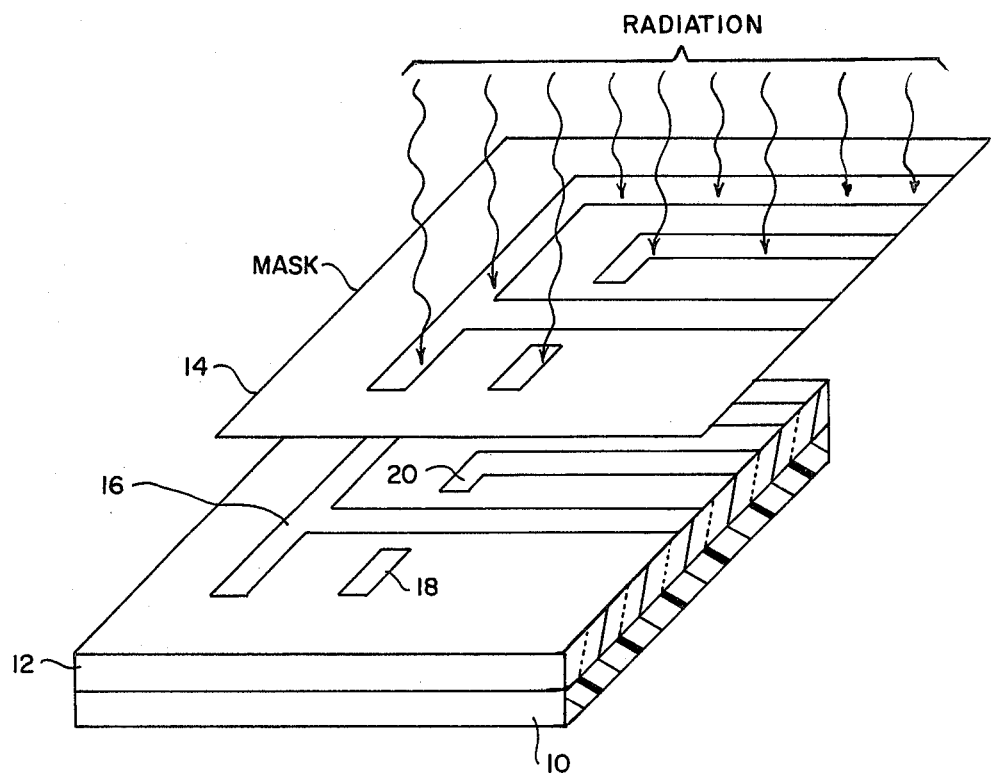
Figure 4:
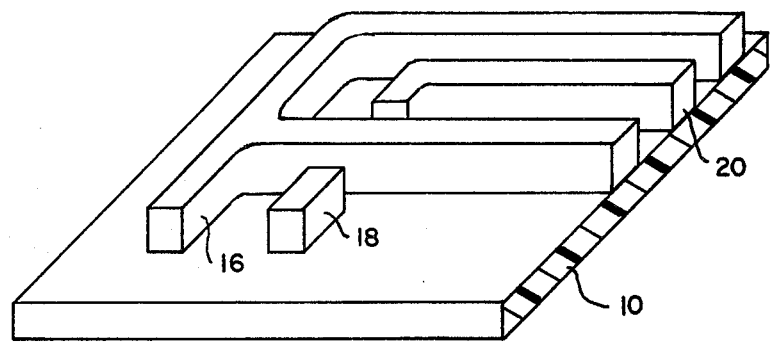

Referring now to FIG. 2, a supporting substrate 10 of proper size and shape is cut from conventional circuit board material. The upper surface is coated with reflective metal, such as aluminum or silver, and then coated with a layer of liquid radiation sensitive plastic 12. The layer is increased to the desired thickness, and while it is still liquid, it is irradiated in a desired pattern as shown in FIG. 3 using a mask 14 or scanning beam and ultraviolet light from a commercially available mercury lamp. The exposed areas 16, 18 and 20 of the plastic layer 12 are thus hardened. A wash with a suitable solvent, such as acetone, removes the remainder of the layer 12, leaving the areas 16, 18 and 20 as shown in FIG. 4.

If the monolithic optical circuit board can be completed with just this pattern of hardened areas, a reflective metal coating may be deposited over these hardened areas, or a layer of plastic cladding of low index of refraction may be placed on the substrate 10 over the hardened areas 16, 18 and 20, and hardened. Since the cladding has a different index of refraction, it will force light within the conductor areas 16, 18 and 20 to reflect light at the interface, as described hereinbefore. The conductor areas 16, 18 and 20 thus function as light guides.

Figure 5:
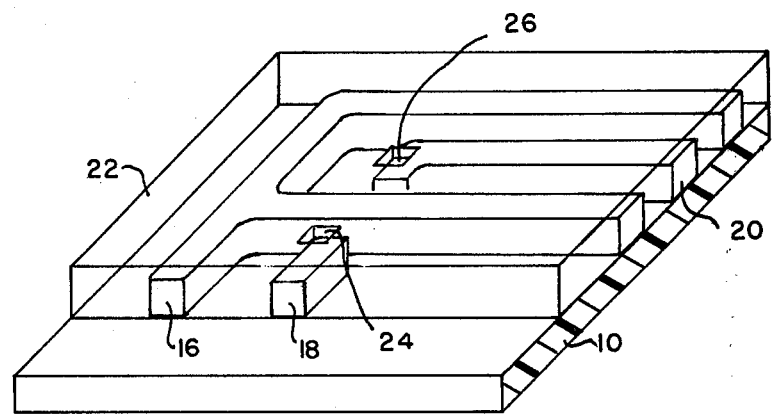
Figure 6:
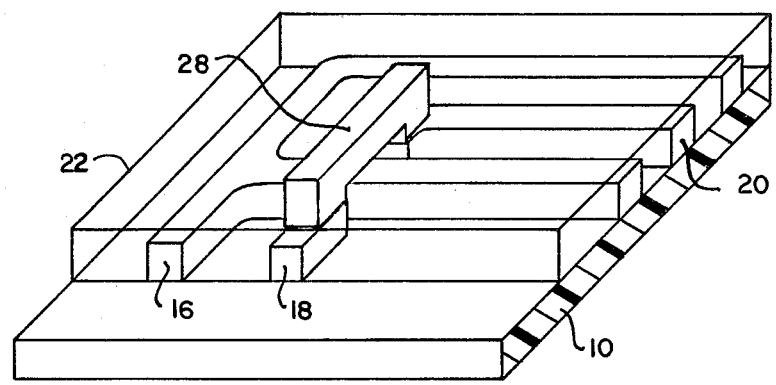

Assuming the conductor area 18 is to be connected to the conductor area 20, a second conductor layer must be provided over the first. To accomplish that, the entire board is coated with a cladding 22 by applying a liquid layer, much as before, and exposing it all to radiation except at areas 24 and 26 where the liquid plastic is washed leaving parts of conductor areas 18 and 20 unclad, as shown in FIG. 5.

All of the steps for producing the first layer are then repeated to produce a second layer by spreading a desired thickness of resin over the cladding 22, thus filling the areas 24 and 26 with plastic down to the conductor areas 18 and 20. The plastic in this case is made to have substantially the same index of refraction as the material of the areas 18 and 20 (the first layer of conductors). Once the area 28 has been exposed using a mask as for the first layer, the unexposed plastic is washed away, leaving the monolithic optical structure of FIG. 6. This is then coated with metal or cladding as described above.

Figure 7:
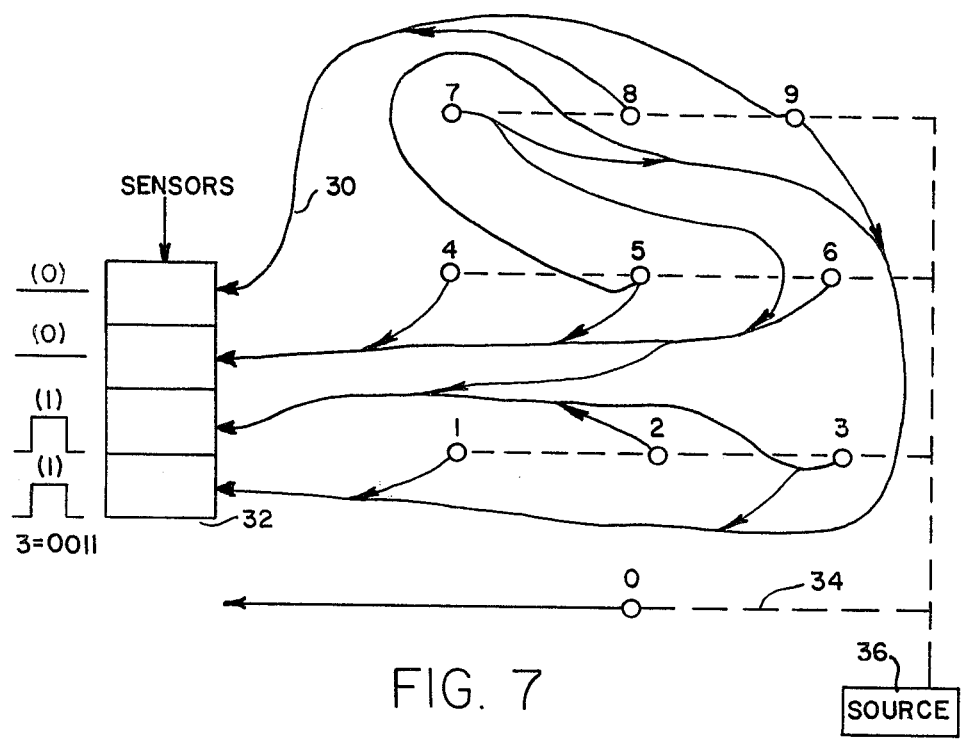
FIG. 7 illustrates schematically an optical keyboard which may be fabricated as shown in FIGS. 2 through 6.

FIG. 7 shows schematically an optical keyboard that converts any digit from 0 through 9 to a 4-bit code. The heavy lines 30 shown represent output conductors from a "keyhole" to necessary sensors 32 for each digit. Dashed lines 34 shown represent illuminating conductors from a source 36 to each of the "keyholes." A copending application filed concurrently herewith as a continuation-in-part of the aforesaid patent application Ser. No. 06/138,165 illustrates the monolithic optical structure for each "keyhole" consisting of two conductors joined at the monolithic structure surface. The first conductor is produced by illumination with a narrow beam directed through liquid plastic at an angle. The second conductor is similarly formed by illumination at a small angle from the perpendicular. Then the unexposed liquid plastic is washed away and a cladding is added to support and protect the conductors which are joined at the surface to form the "keyhole." Alternatively, the monolithic structure could be performed by fabricating vertical slices of the monolithic circuit structure with the completed slices stacked together as disclosed in U.S. application Ser. No. 06/138,164 filed Apr. 7, 1980, by Robert S. Jamieson, and assigned to the assignee of this application.

Since the entire keyboard is thus made of plastic, it is inherently weatherproof. Water and other elements in the atmosphere will not interfere with proper operation of the keyboard, because it is all encapsulated in cladding plastic. In operation, an illuminating beam from a source 36 (FIG. 7) striking the surface of the keyboard (at less than the critical angle determined by its index of refraction) passes to the outside space. There is little or no light reflected internally, since the source light conductor approaches the contact surface at a steep angle—its departure from the normal to the plane of the contact surface being held to a value less than the critical angle of refraction of the light conductor material. Of course, the closer to perpendicular, the smaller the percentage of light reflected.

All devices, such as the light sensors 32, that are included in the optical circuit are also protected from the weather. That is a distinct advantage in such applications as a keyboard for any outdoor security system, such as a garage door opening system of an apartment house where each tenant is given a code number for operation of the garage door. The code number could be changed periodically, as when a tenant having the code terminates and is no longer entitled to have access to the secure area.

Since branched light conductors can easily be made, it is desirable to illuminate all the keys with the same light source 36—eliminating problems with variations in intensity from key to key, but several light sources may be used. In either case, the illumination level can be high enough to swamp out even bright ambient light. If narrow-band light is used, along with the corresponding filters in the sensing conductors, ambient effects are reduced—especially if the source emits a wavelength not strongly present in the ambient light—as, for example, infrared or ultraviolet light. Filtering may be accomplished by proper tinting of the output conductor material during fabrication.

This branching capability can be used in the sensing conductors as well; by proper arrangement of sensors the coding desired can be "wired in" to the arrangement of light conductors during fabrication. Thus direct conversion of decimal keys into binary coding can be done with only the passive light conductors. For example, FIG. 7 shows schematically a keyboard with the sensing conductors 30 leading to the proper binary level sensors 32. Touching a "3" reflects light into both the first and second place binary level sensors to make a binary 0011. Any reasonable coding can be employed; ASCII, and other alphanumeric codes lend themselves easily to this approach, as do other codes such as octal, hexadecimal, biquinary, etc.

Figure 8:
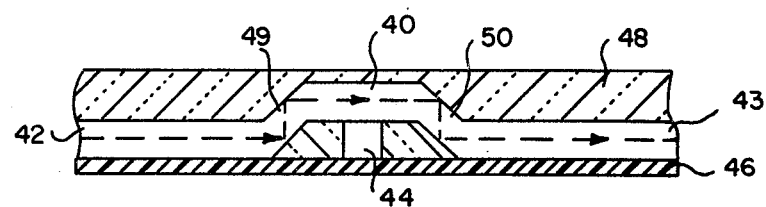
FIG. 8 illustrates in a cross section a preferred structural arrangement for an optical path bridge over another optical path to optimize light reflection over the bridge.
Figure 9A:
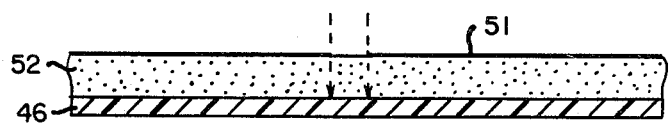
FIGS. 9a through 9g illustrate steps used to form the structure of FIG. 8.
Figure 9B:
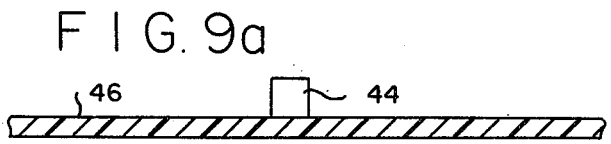

Referring now to FIG. 8, a preferred structural arrangement is shown for an optical bridge 40 to conduct light through conductors 42, 43 over another perpendicular conductor 44. The structure is formed on a substrate 46 using radiation sensitive plastic, as described for the structure of FIG. 6, and then coated with a cladding 48. The difference in the structure is that instead of forming columns up to the bridge 40 from the conductors 42, 43, which require light to be inefficiently reflected through two right angles at each end of the bridge, there is provided an up ramp 49 and a down ramp 50 at 45° angles to optimize reflection of light over the bridge, i.e., to minimize loss of light to the structure surrounding the conductors and bridge. FIGS. 9a through 9b illustrate the steps that may be employed.

These steps are generally as described with reference to FIGS. 2 through 6, except that to form the ramps, additional steps are required. Briefly, the conductor 44 is formed using a mask 51 to expose a liquid radiation sensitive plastic 52 on the substrate 46 and washing away the unexposed plastic. The process thus far is illustrated by FIGS. 9a and 9b.

Figure 9C:
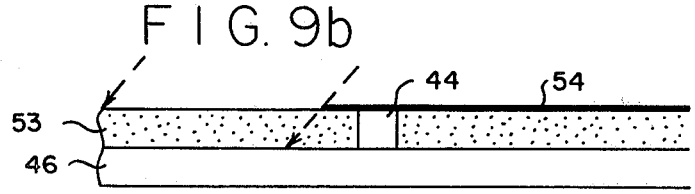
Figure 9D:
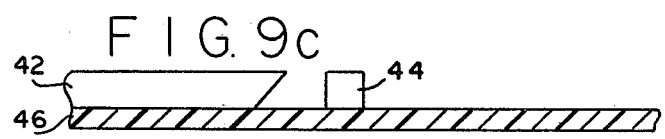
Figure 9E:
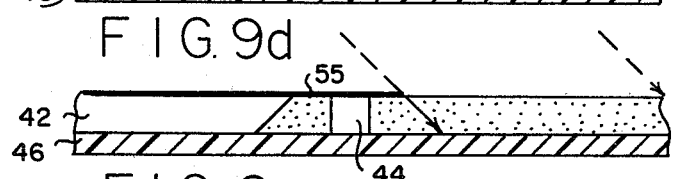
Figure 9F:
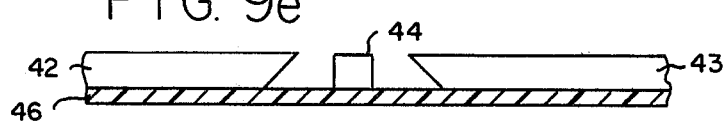

The substrate 42 is next covered to the top of the conductor 44 with liquid radiation sensitive plastic 53. Then a mask 54 is employed to form the lower half of the ramp 49 by exposing the plastic at a 45° angle of incident radiation, as shown in FIG. 9c. The unexposed plastic is washed away, leaving the structure shown in FIG. 9d. The process is repeated for the lower half of the ramp 50, using a mask 55, as illustrated in FIGS. 9e and 9f. Note that in practice the steps illustrated by FIGS. 9c through 9f could be combined into one by use of the proper mask and exposing with light at two angles, namely +45° and −45° for the vertical.

Figure 9G:
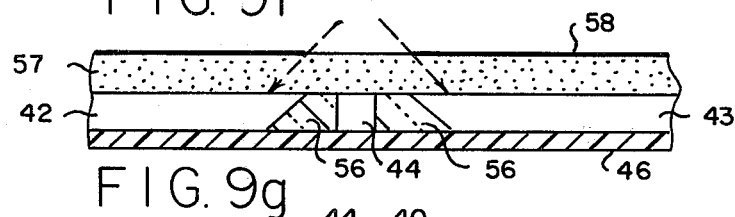
Figure 9H:
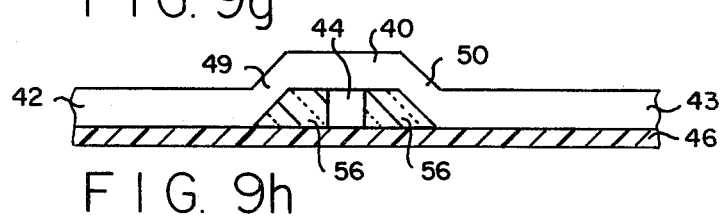

The space between these lower halves of the ramps and the conductor 44 is filled with cladding 56 before another layer 57 of liquid radiation sensitive plastic is uniformly coated and exposed through a mask 58, as shown in FIG. 9g. The exposure through the mask is carried out with an angle of incidence at both +45° and −45° from normal to produce at the same time both upper halves of the ramps 49 and 50, and the bridge 40. When the unexposed plastic is washed away, the structure remaining is as shown in FIG. 9h. Cladding the completed structure yields the structure shown in FIG. 8. Note that the conductor 44 is at right angles to the bridge 40, which minimizes any coupling of light from one into the other, but to completely isolate them optically, a thin film of reflection material may be deposited between them. Alternatively, columns may be formed to separate them as will now be described with reference to FIG. 10.

Figure 10:
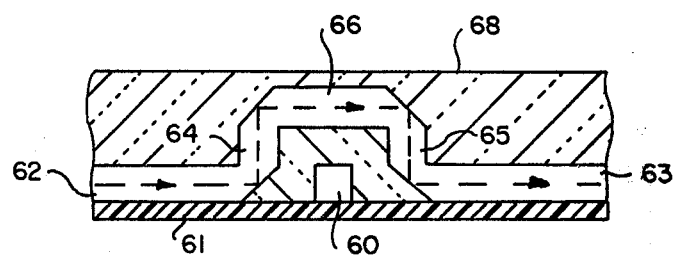
FIG. 10 illustrates an alternative optimum structure.

Referring now to FIG. 10, a conductor 60 is first formed on a substrate 61, and conductors 62 and 63 are formed with the lower halves of the required ramps, as in FIGS. 9a through 9f. Then vertical columns 64 and 65 are formed using a mask in a separate layer of plastic, and finally a bridge 66 is formed in a third layer of plastic in a manner illustrated in FIGS. 9g and 9h. An advantage of this triple layer structure over the double layer structure is separation between the bridge 66 and the conductor 60. The space between the bridge and the conductor is filled with cladding to prevent even minimal coupling of light between the bridge and the conductor.

Although particular embodiments of the invention have been described and illustrated herein, it is recognized that modifications and variations may readily occur to those skilled in the art. Consequently, it is intended that the claims be interpreted to cover such modifications and equivalents.

What is claimed is:

1. A method for making a multilevel monolithic optical circuit on a supporting surface, said optical circuit consisting of conductors on at least two levels with optical coupling of conductors on one level to optical conductors on the second level through optical conductive columns, comprising the steps of preparing the supporting surface to be reflective to light in said circuit at the interface between light conductors of said circuit and said surface, spreading a layer of liquid radiation sensitive plastic on said surface to a thickness desired for said conductors of said circuit, exposing said radiation sensitive plastic to radiation in a pattern desired for said conductors, thereby to harden said liquid radiation sensitive plastic to form said circuit conductors on a first level, washing away unexposed liquid radiation sensitive plastic, coating said pattern of optical conductors thus formed on said support surface with liquid radiation sensitive cladding material that will assure light in said conductors on said first level to be reflected by the interface between said conductors and said coating material, exposing said radiation sensitive cladding material except over specified areas of conductors of said first level where optical coupling is to be made with conductors of said second level, thereby to harden said radiation sensitive cladding material except over said specified areas, washing away said unexposed radiation sensitive cladding material over said specified areas, spreading a second layer of liquid radiation sensitive plastic on said radiation sensitive cladding material and allowing said liquid radiation sensitive plastic thus spread to fill areas where radiation sensitive cladding material has been washed away, said second layer of liquid radiation sensitive plastic having an index of refraction substantially the same as said first layer of liquid radiation sensitive plastic used to form said first level of conductors, exposing said second layer of radiation sensitive plastic to radiation in a desired pattern for said conductors, thereby to harden said second layer of liquid radiation sensitive plastic to form a second level of conductors with optical coupling to said first level of conductors, and coating said second level of conductors of said optical circuit thus formed with material that will assure light in said conductors to be reflected by the interface between said second level of conductors and said coating material.

2. A method as defined in claim 1 wherein the ends of conductors on said first level are terminated with faces at 45° to reflect light up to said second level through optical coupling columns by exposing said first layer of liquid radiation sensitive plastic with a beam of light at 45°, and the ends of conductors on said second level are terminated with faces directly over and parallel with faces at 45° in the first level of conductors to complete optical coupling of conductors in the second level with optical conductors on the first level by exposing said second layer of liquid radiation sensitive plastic with a beam of light at 45°.

3. A method as defined in claim 1 wherein exposure for said pattern of conductors on said first level is comprised of a pattern that includes two conductors normal to each other, and the method includes forming in the second level of conductors a bridge for one crossing over the other of said two conductors in the first level of conductors.

4. A method as defined in claim 3 wherein the other conductor on the first level is terminated with a face at 45° to reflect light upward by exposing said first layer of liquid radiation sensitive plastic with a beam of light at 45°, and said bridge in the second level is terminated at its ends with faces parallel to and directly over 45° faces in the first level by exposing said second layer of liquid radiation sensitive plastic with a beam of light at 45°.

* * * * *